US011243331B2

(12) United States Patent
Dann

(10) Patent No.: US 11,243,331 B2
(45) Date of Patent: Feb. 8, 2022

(54) TECHNIQUES FOR GEOLOCATION AND CLOUD DETECTION WITH VOLTAGE DATA FROM SOLAR HOMES

(71) Applicant: ITRON, INC., Liberty Lake, WA (US)

(72) Inventor: Michael Hogan Dann, Oakland, CA (US)

(73) Assignee: ITRON, INC., Liberty Lake, WA (US)

( * ) Notice: Subject to any disclaimer, the term of this patent is extended or adjusted under 35 U.S.C. 154(b) by 594 days.

(21) Appl. No.: 16/186,450

(22) Filed: Nov. 9, 2018

(65) Prior Publication Data

US 2020/0150309 A1    May 14, 2020

(51) Int. Cl.
| | |
|---|---|
| *G01W 1/10* | (2006.01) |
| *G01R 19/25* | (2006.01) |
| *G06Q 50/06* | (2012.01) |
| *H04W 84/18* | (2009.01) |

(52) U.S. Cl.
CPC .......... *G01W 1/10* (2013.01); *G01R 19/2513* (2013.01); *G06Q 50/06* (2013.01); *H04W 84/18* (2013.01)

(58) Field of Classification Search
CPC ..... G01W 1/10; G01R 19/2513; G01R 19/25; G06Q 50/06; H04W 84/18; G01J 1/00; H02J 3/00
See application file for complete search history.

(56) References Cited

U.S. PATENT DOCUMENTS

| 9,661,473 B1 * | 5/2017 | Jarvis | H04W 4/043 |
|---|---|---|---|
| 2007/0035135 A1 * | 2/2007 | Yoshida | F03D 7/048 |
| | | | 290/44 |
| 2012/0140946 A1 * | 6/2012 | Yen | H04R 1/1083 |
| | | | 381/92 |
| 2013/0013206 A1 * | 1/2013 | Guha | G01W 1/10 |
| | | | 702/3 |

(Continued)

FOREIGN PATENT DOCUMENTS

WO    2014/109020 A1    7/2014

OTHER PUBLICATIONS

Hitachi, Method and Device for Weather Prediction, and Method and Device for Controlling Electric Power System, 2014, WO2014109020A1 (ESPACENET Machine Translation) (Year: 2014).*

(Continued)

*Primary Examiner* — Alexander Satanovsky
(74) *Attorney, Agent, or Firm* — Artegis Law Group, LLP

(57) ABSTRACT

A wireless mesh network includes a group of nodes configured to predict cloud movements based on voltage time series data. A node residing in the wireless mesh network records voltage fluctuations at a site where solar power is generated. The voltage fluctuations occur when an advancing cloud reduces solar irradiance at the site, thereby reducing solar power generation. The node correlates these voltage fluctuations with other voltage fluctuations recorded by other nodes at other sites where solar power is generated. The node computes a time offset between these voltage (Continued)

fluctuations that corresponds to the time needed for the cloud to advance between the different sites. Based on this time offset and the locations of the various nodes, the node estimates a wind vector. The wind vector can be used to perform near-term solar forecasting by predicting when the cloud will advance to other sites and reduce solar power generation.

20 Claims, 13 Drawing Sheets

(56) References Cited

U.S. PATENT DOCUMENTS

| | | | |
|---|---|---|---|
| 2013/0166211 A1* | 6/2013 | Kerrigan | G01V 99/00 702/5 |
| 2014/0012524 A1 | 1/2014 | Flammer, III | |
| 2014/0156322 A1 | 6/2014 | Monforte et al. | |
| 2015/0134251 A1* | 5/2015 | Bixel | G01W 1/10 702/3 |

OTHER PUBLICATIONS

Achim Woyte, Mar. 2006, Voltage Fluctuations on Distribution Level Introduced by Photovoltaic Systems, IEEE Transactions on Energy Conversion, vol. 21, No. 1 (Year: 2006).*

Christian Renner, 2015, A System for Efficient Dissemination of Weather Forecasts for Sustainable Solar-Powered Sensors, Institute of Computer Engineering, Universität zu Läbeck, Läbeck, Germany (Year: 2015).*

Mikio Kuwabara, Wireless Transmission Timing Measuring Method and Apparatus for Executing the Same, Apr. 8, 2004, JP 2004112244 (Global Dossier English Translation) (Year: 2004).*

Tatsuki Nuduka, System monitoring device and program, Dec. 7, 2017, WO 2017/208623A1 (Global Dossier English Translation). (Year: 2017).*

Ling-Ling Li et al., "Short-term output power forecasting of photovoltaic systems based on the deep belief net", Advances in Mechanical Engineering, 2017, vol. 9(9) 1-13.*

"Solar power forecasting", Wikipedia.org, at https://en.wikipedia.org/wiki/Solar_power_forecasting, Version dated Nov. 6, 2018, retrieved on Mar. 29, 2020, https://en.wikipedia.org/w/index.php?title=Solar_power_forecasting&oldid=867523721, 6 pages.

"Posterior probability", Wikipedia.org, at https://en.wikipedia.org/wiki/Posterior_probability, Version dated Oct. 31, 2018, retrieved on Mar. 29, 2020, https://en.wikipedia.org/w/index.php?title=Posterior_probability&oldid=866638114, 3 pages.

"Kalman filter", Wikipedia.org, at https://en.wikipedia.org/wiki/Kalman_filter, Version dated Nov. 1, 2018, retrieved on Mar. 29, 2020, https://en wikipedia.org/w/index.php?title=Kalman_filter &oldid=866849029, 33 pages.

"Cross-correlation", Wikipedia.org, at https://en.wikipedia.org/wiki/Cross-correlation, Version dated Sep. 19, 2018, retrieved on Mar. 29, 2020, https://en.wikipedia.org/w/index.php?title=Cross-correlation &oldid=860241622, 6 pages.

"Conjugate prior", Wikipedia.org, at https://en.wikipedia.org/wiki/Conjugate_prior, Version dated Nov. 8, 2018, retrieved on Mar. 29, 2020, https://en.wikipedia.org/w/index.php?title=Conjugate_prior &oldid=867837925, 6 pages.

International Search Report for application No. PCT/US2019/060563 dated Jan. 30, 2020.

* cited by examiner

TECHNIQUES FOR GEOLOCATION AND CLOUD DETECTION WITH VOLTAGE DATA FROM SOLAR HOMES

BACKGROUND

Field of the Various Embodiments

Embodiments of the present invention relate generally to wireless network communications and systems and, more specifically, to techniques for geolocation and cloud detection with voltage data from solar homes.

Description of the Related Art

A conventional electricity distribution infrastructure includes a plurality of electricity meters configured to monitor the consumption of electricity at various locations, including residences and businesses, among others. In many implementations, each electricity meter is further configured to communicate with a utility provider that owns and/or operates the electricity distribution infrastructure. In these implementations, a given electricity meter periodically transmits electricity consumption data to the utility provider.

The utility provider collects electricity consumption data from many different electricity meters and then uses that data to make predictions about future electricity demand. For example, the utility provider could determine that a spike of electricity consumption regularly occurs around 6:00 pm on weekday evenings (presumably when many people arrive home from work and begin consuming electricity). The utility provider could then predict that the demand for electricity should increase around 6:00 pm on any given weekday. As a general matter, predicting the demand for electricity allows the utility provider to scale electricity production, as needed, to meet that predicted demand, which improves the efficiency with which electricity is provided.

Electricity meters oftentimes are installed at locations that use solar panels to generate electricity. For example, a so-called "solar home" could have solar panels on the roof that generate electricity from sunlight. To some degree, the generated electricity at a given location offsets the amount of electricity consumed at that location. Accordingly, to accurately predict the net electricity consumption at such a location, the amount of electricity generated at the location needs to be computed. Notably, however, predicting the amount of electricity generated via solar panels can be difficult. In particular, the amount of electricity generated by a solar panel varies based on the amount of solar irradiance at the solar panel. On a given day, for example, the amount of solar irradiance at a given solar panel location can vary, at least in part, due to the amount of cloud cover present at that location throughout the day.

Various approaches to short-term weather forecasting (termed "nowcasting") have been developed to estimate the amount of solar irradiance within a given region or at a given location based on the amount of cloud cover. Based on such estimates, a utility company can attempt to predict the amount of electricity generated by solar panels within that given region or at that given location in an effort to derive more accurate predictions of electricity demand.

One approach to nowcasting involves estimating solar irradiance based on images captured from one or more satellites that depict the cloud cover across a broad region of land. However, satellite-based nowcasting is typically quite expensive because of the cost involved in launching and maintaining satellites. Satellite-based nowcasting also can be inaccurate due to the low resolution with which satellite images are typically captured. Finally, satellite-based nowcasting can suffer from periodic unavailability depending on the orbital trajectories of the satellites used to capture the images.

Another approach to nowcasting involves estimating solar irradiance at a specific location using a skyward facing camera capable of capturing high-resolution images of clouds. However, this ground-based nowcasting approach is somewhat expensive because camera usually includes costly optics designed to capture high-resolution, wide-angle images. Ground-based nowcasting also can be inaccurate because images of clouds do not necessarily indicate how much solar irradiance arrives at the ground. Additionally, ground-based nowcasting is available only at the specific location where the camera is deployed and is not available in areas where the camera is not deployed.

As the foregoing illustrates, what is needed in the art are more effective ways to predict the amount of electricity generated by solar panels within a given region or at a given location.

SUMMARY

Various embodiments include computer-implemented method for near-term solar forecasting via a network of nodes, including measuring, at a first node, a first plurality of voltage fluctuations within a first power line to generate a first voltage time series, where the first node resides at a first location within the network and is coupled to the first power line, and one or more of the voltage fluctuations occur in response to changes in solar irradiance at the first location, generating, at the first node, a first cross-correlation between the first voltage time series and a second voltage time series generated by a second node, where the second nodes resides at a second location within the network and communicates with the first node via the network, determining, at the first node, a first time offset based on the first cross-correlation, where the first time offset indicates a first delay between a first voltage fluctuation included in the first voltage time series and a second voltage fluctuation included in the second voltage time series, and computing, at the first node, a first wind vector based on the first location, the second location, and the first time offset, where the first wind vector indicates one or more points in time when solar power generation decreases at one or more locations within the network.

At least one technological advantage of the disclosed techniques relative to the prior art is that a utility provider can anticipate demand for electricity based on real-time predictions of current weather conditions. Accordingly, the utility provided can scale electricity production to meet the anticipated demand, thereby improving the efficiency with which electricity is provided to consumers.

BRIEF DESCRIPTION OF THE DRAWINGS

So that the manner in which the above recited features of the various embodiments can be understood in detail, a more particular description of the inventive concepts, briefly summarized above, may be had by reference to various embodiments, some of which are illustrated in the appended drawings. It is to be noted, however, that the appended drawings illustrate only typical embodiments of the inventive con

DETAILED DESCRIPTION

Figure 1A:
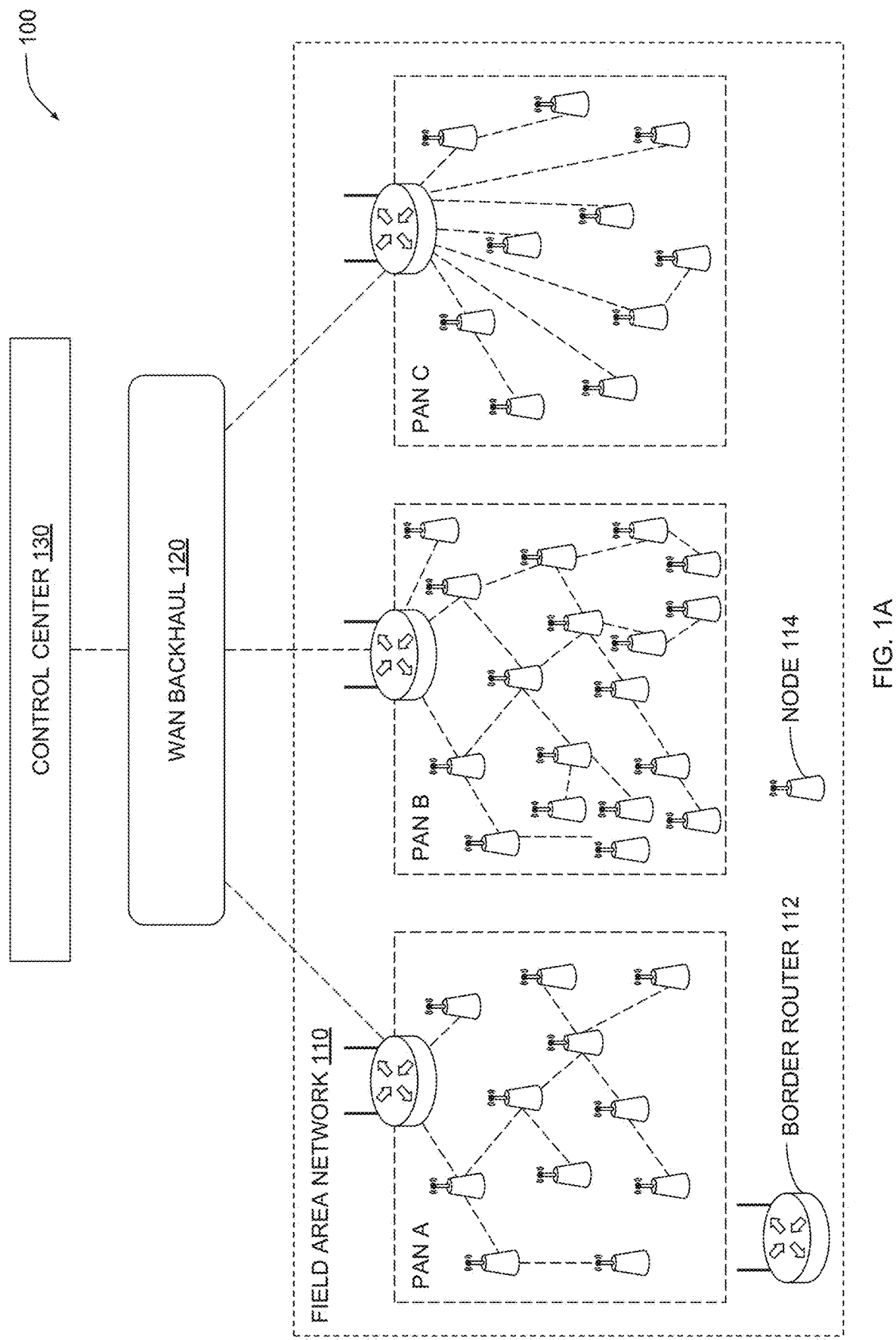
- FIG. 1A illustrates a network system configured to implement one or more aspects of the present invention.

In the following description, numerous specific details are set forth to provide a more thorough understanding of the various embodiments. However, it will be apparent to one of skilled in the art that the inventive concepts may be practiced without one or more of these specific details.

As noted above, utility providers deploy electricity meters to locations that consume electricity in order to track electricity consumption and predict demand for electricity. Some locations generate electricity in addition to consuming electricity, which complicates how accurately the demand for electricity can be predicted. For example, a given location could generate an amount of electricity via solar panels that depends on the current cloud cover at the given location.

So-called "nowcasting" services provide estimates of the solar irradiance at specific areas or locations based, among other things, on the amount of cloud cover at those areas or locations. Satellite-based nowcasting services estimate solar irradiance relative to the current cloud cover within a given region based on images of the given region captured via satellite. Ground-based nowcasting services estimate solar irradiance relative to the current cloud cover at a specific location based on images of the sky captured from the specific location. However, both types of nowcasting services are expensive, inaccurate, and suffer from various availability issues.

To address these issues, embodiments of the invention include a wireless mesh network that includes a group of nodes configured to predict cloud movements based on voltage time series data. A node residing in the wireless mesh network records voltage fluctuations at a site where solar power is generated. The voltage fluctuations occur when an advancing cloud reduces solar irradiance at the site and reduces solar power generation. The node correlates these voltage fluctuations with other voltage fluctuations recorded by other nodes at other sites where solar power is generated. The node computes a time offset between these voltage fluctuations. The time offset corresponds to the time needed for the cloud to advance between the different sites. Based on this time offset and the locations of the various nodes, the node estimates a wind vector. The wind vector can be used to perform near-term solar forecasting by predicting when the cloud will advance to other sites and reduce solar power generation at those other sites. The node can also estimate the location of the other nodes, if needed, based on computed time offsets and historical weather information.

At least one technological advantage of the disclosed techniques is that a utility provider can anticipate demand for electricity based on real-time predictions of current weather conditions. Accordingly, the utility provider can scale electricity production to meet the anticipated demand, thereby improving the efficiency with which electricity is provided to consumers. Another technological advantage of the disclosed techniques is that nodes can determine the locations of other nodes in situations where the locations of other nodes are unknown or inaccurate, thereby facilitating the prediction of real-time weather conditions. These technological advantages represent multiple technological advancements relative to prior art approaches.

System Overview

FIG. 1A illustrates a network system configured to implement one or more aspects of the present embodiments. As shown, network system 100 includes a field area network (FAN) 110, a wide area network (WAN) backhaul 120, and a control center 130. FAN 110 is coupled to control center 130 via WAN backhaul 120. Control center 130 is configured to coordinate the operation of FAN 110.

FAN 110 includes personal area network (PANs) A, B, and C. PANs A and B are organized according to a mesh network topology, while PAN C is organized according to a star network topology. Each of PANs A, B, and C includes at least one border router 112 and one or more nodes 114.

Nodes 114 can draw power from an external power source, such as mains electricity or a power grid, or draw power from an internal power source, such as a battery. Nodes 114 can operate on a continuous basis without powering down for extended periods of time or operate intermittently and power down for extended periods of time to conserve battery power. Nodes 114 are configured to gather sensor data, process the sensor data, and communicate data processing results and other information to control center 130. Border routers 112 operate as access points to provide nodes 114 with access to control center 130. In one embodiment, border routers 112 are implemented via nodes 114.

Nodes 114 are configured to communicate directly with one or more adjacent nodes 114 via bi-directional communication links. The communication links may be wired or wireless links, although in practice, adjacent nodes of a given PAN exchange data with one another by transmitting data packets via wireless radio frequency (RF) communications. Nodes 114 are configured to perform a technique known in the art as "channel hopping" in order to periodically receive data packets on varying channels. As known in the art, a "channel" may correspond to a particular range of frequencies. In one embodiment, a node 114 may compute a current receive channel by evaluating a Jenkins hash function based on a total number of channels, the media access control (MAC) address of the node, and other information associated with the node.

Each node 114 within a given PAN may implement a discovery protocol to identify one or more adjacent nodes or "neighbors." A node 114 that has identified an adjacent, neighboring node may establish a bi-directional communication link with the neighboring node. Each neighboring node may update a respective neighbor table to include information concerning the other node, including the MAC address of the other node as well as a received signal strength indication (RSSI) of the communication link established with that node.

Nodes 114 may compute the channel hopping sequences of adjacent nodes to facilitate the successful transmission of data packets to those nodes. In embodiments where nodes implement the Jenkins hash function, a node 114 computes a current receive channel of an adjacent node using the total number of channels, the MAC address of the adjacent node, and a time slot number assigned to a current time slot of the adjacent node.

Any of the nodes 114 discussed above may operate as a source node, an intermediate node, or a destination node for the transmission of data packets. A given source node may generate a data packet and then transmit the data packet to a destination node via any number of intermediate nodes (in mesh network topologies). The data packet may indicate a destination for the packet and/or a particular sequence of intermediate nodes to traverse in order to reach the destination node. In one embodiment, each intermediate node may include a forwarding database indicating various network routes and cost metrics associated with each route.

Nodes 114 may transmit data packets across a given PAN and across WAN backhaul 120 to control center 130. Similarly, control center 130 may transmit data packets across WAN backhaul 120 and across any given PAN to a particular node included therein. As a general matter, numerous routes may exist which traverse any of PANs A, B, and C and include any number of intermediate nodes, thereby allowing any given node or other component within network system 100 to communicate with any other node or component included therein.

Control center 120 includes one or more server machines (not shown) configured to operate as sources for, or destinations of, data packets that traverse within network system 100. The server machines may query nodes 114 within network system 100 to obtain various data, including raw or processed sensor data, power consumption data, node/network throughput data, status information, and so forth. The server machines may also transmit commands and/or program instructions to any node within network system 100 to cause those nodes to perform various operations. In one embodiment, each server machine is a computing device configured to execute, via a processor, a software application stored in a memory to perform various network management operations.

Nodes 114 may likewise include computing device hardware configured to perform processing operations and execute program code. Each node may further include various analog-to-digital and digital-to-analog converters, digital signal processors (DSPs), harmonic oscillators, transceivers, and any other components generally associated with RF-based communication hardware. An exemplary node that may operate within network system 100 is described in greater detail below in conjunction with FIG. 2A.

In operation, nodes 114 are configured to monitor the flow of electricity at locations that consume and/or generate electricity. For example, a given node 114 that is configured as an electricity meter could be coupled to a power line that supplies electricity to a residence. The given node 114 could monitor various attributes of the electricity flowing through the power line, including voltage load across a range of times, total power drawn over a time interval, and so forth. Nodes 114 generate metrology data that reflects electricity consumption at locations being monitored and then transmit this metrology data to control center 130 and/or share the metrology data to other nodes 114 across FAN 110.

When multiple nodes 114 are deployed to locations that generate electricity via solar panels, those nodes 114 can interoperate in order to perform near-term solar forecasting. In particular, each node 114 generates a voltage time series indicating the voltage load at a corresponding location over time. Nodes 114 share voltage time series data within one another, either indirectly via control center 130 or directly across FAN 110. A given node 114 cross-correlates a voltage time series generated at the given node 114 with one or more voltage time series generated at one or more other nodes 114 in order to identify correlations between voltage fluctuations within those voltage time series. Some correlations occur due to normal voltage fluctuations that occur within the electricity distribution infrastructure and that typically originate upstream of nodes 114. Other correlations occur due to the presence of an advancing cloud front that occludes the sun and diminishes the capacity of solar panels to generate electricity, as described in greater detail below in conjunction with FIG. 1B.

Figure 1B:
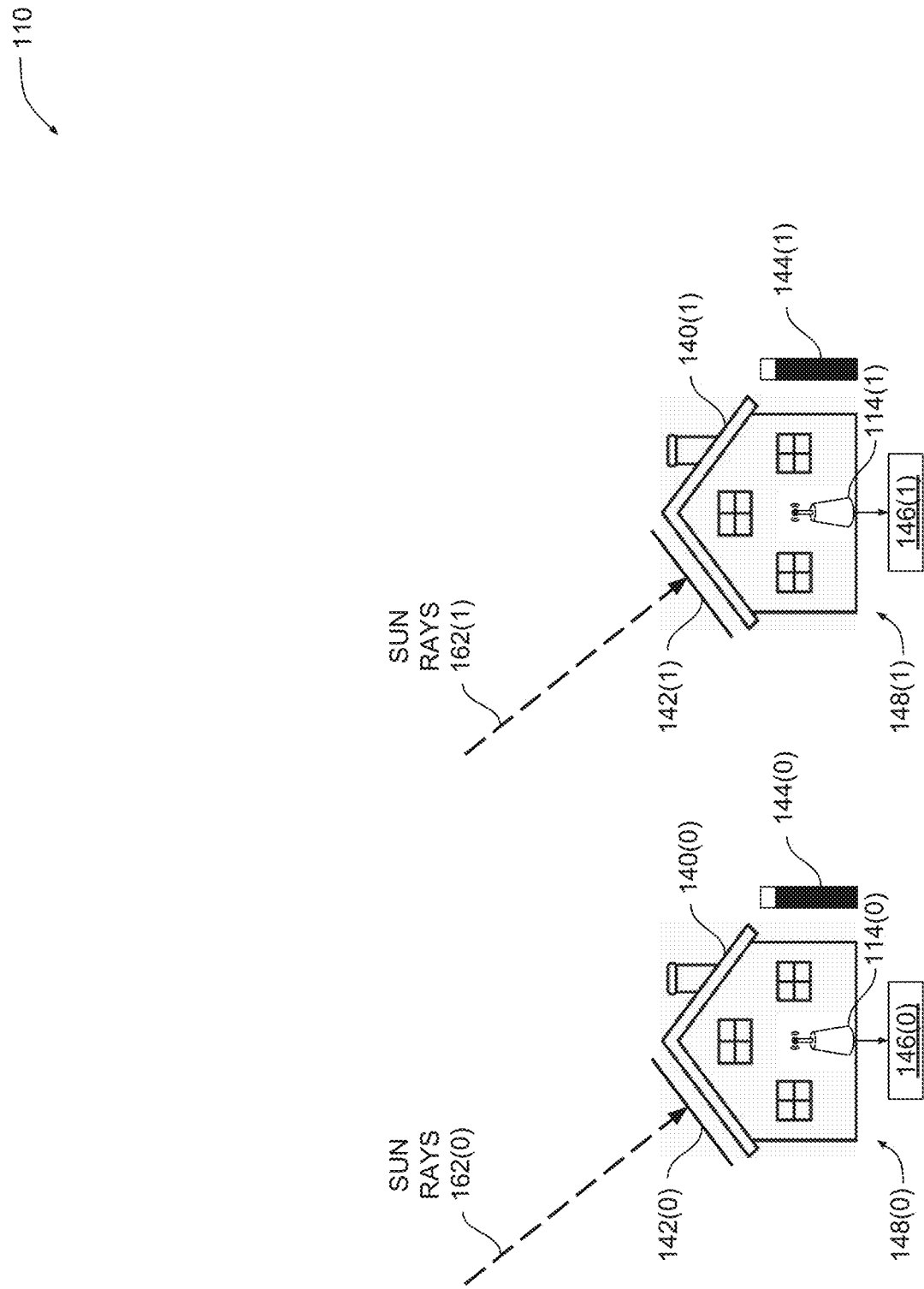
FIG. 1B illustrates different nodes within the network system of FIG. 1A deployed to locations that generate electricity, according to various embodiments of the present invention.

FIG. 1B illustrates different nodes within the network system of FIG. 1A deployed to locations that generate electricity, according to various embodiments of the present invention. As shown, nodes 114(0) and 114(1) are deployed within a residential environment that includes sites 140(0) and 140(1). Site 140(0) and node 114(0) occupy a location 148(0), while site 140(1) and node 114(1) occupy a location 148(1). Nodes 114 generally monitor the flow of electricity to sites 140 from connected power lines (not shown) in order to measure electricity consumption at those sites. In so doing, each node 114 generates a voltage time series 146 indicating voltage fluctuations over time.

Sites 140(0) and 140(1) are configured with solar panels 142(0) and 142(1), respectively. Solar panels 142 are irradiated by the sun, which transmits sun rays 162(0) and 162(1) to solar panels 142(0) and 142(1), respectively. Solar panel 142(0) generates electricity at a particular rate based on sun ray 162(0), as indicated by solar panel output 144(0). Similarly, solar panel 142(1) generates electricity at a particular rate based on sun ray 162(1), as indicated by solar panel output 144(1). Electricity consumption at a given site 140 can be offset by electricity generated by solar panels 142. Solar panels 142 generate different amounts of electricity depending on the amount of received sunlight. The amount of sunlight received at solar panels 142 can vary based on the presence of a cloud cover, as shown in FIG. 1C.

Figure 1C:
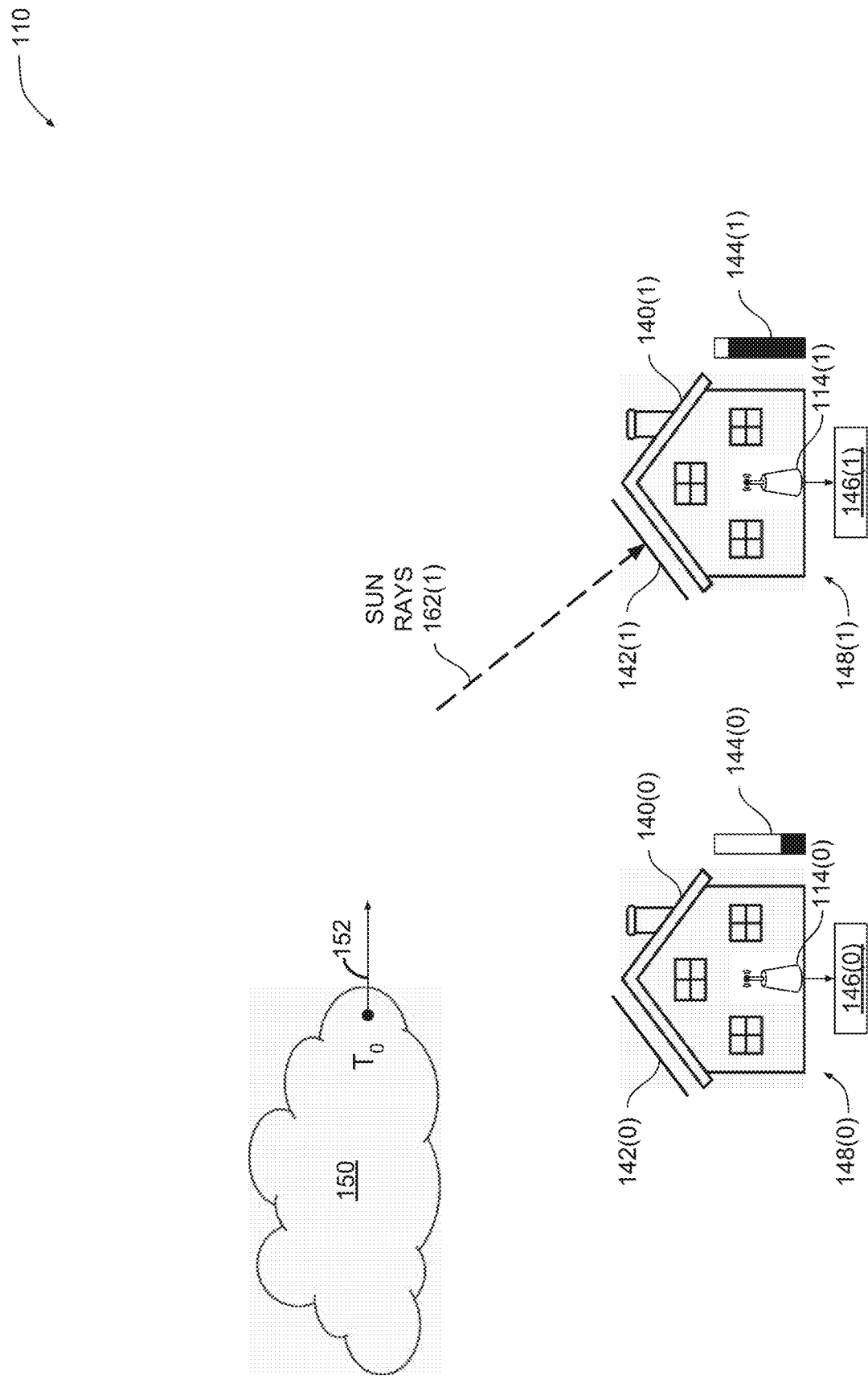
FIG. 1C illustrates how a first node within the network system of FIG. 1A measures a first voltage fluctuation caused by cloud movements, according to various embodiments of the present invention.

FIG. 1C illustrates how a first node within the network system of FIG. 1A measures a first voltage fluctuation caused by cloud movements, according to various embodiments of the present invention. As shown, a cloud 150 advances from left to right in response to wind having a direction and velocity defined via a wind vector 152. At time $T_0$, cloud cover 150 partially occludes the sun and therefore inhibits sun ray 162(0) from reaching solar panel 142(0). Accordingly, solar panel 142(0) generates a lower amount of electricity and solar panel output 144(0) decreases accordingly. When solar panel output 144(0) decreases, electricity generated by solar panel 142(0) offsets electricity consumption at site 140(0) to a lesser degree. In response, site 140(0) draws an increased amount of power from connected power lines to meet electricity demand. At time $T_0$, node 114(0) detects voltage fluctuations at site 140(0) associated with this increased power draw and records these fluctuations in voltage time series 146(0).

Figure 1D:
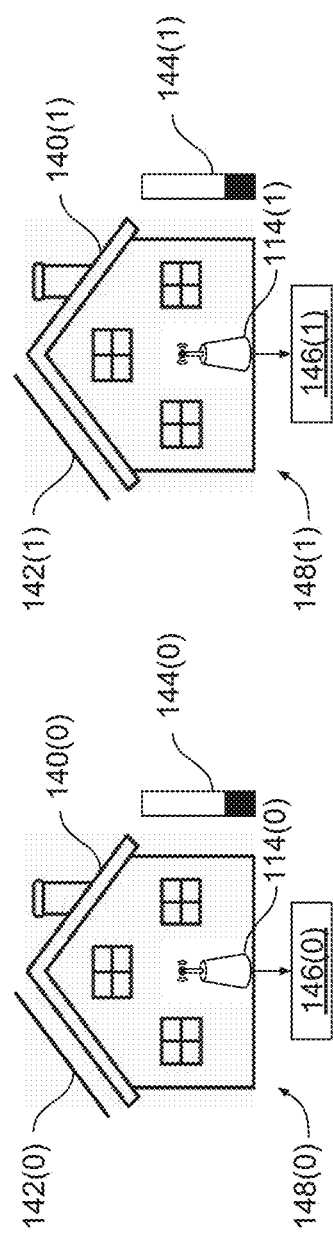
FIG. 1D illustrates how a second node within the network system of FIG. 1A measures a second voltage fluctuation caused by cloud movements, according to various embodiments of the present invention.
Figure 1D:
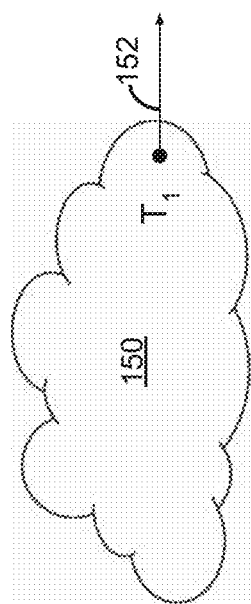

FIG. 1D illustrates how a second node within the network system of FIG. 1A measures a second voltage fluctuation caused by cloud movements, according to various embodiments of the present invention. As shown, cloud cover 150 advances farther right and at time $T_1$ inhibits sun ray 162(1) from reaching solar panel 142(1). Accordingly, solar panel 142(1) generates a lower amount of electricity and solar panel output 144(1) decreases accordingly. In like fashion as described above, when solar panel output 144(1) decreases, electricity generated by solar panel 142(1) offsets electricity consumption at site 140(1) to a lesser degree, causing site 140(1) to draw an increased amount of power to meet electricity demand. At time $T_1$, node 114(1) detects voltage fluctuations at site 140(1) associated with this increased power draw and records these fluctuations in voltage time series 146(1).

Nodes 114 share voltage time series 146 with one another in order to facilitate the estimation of wind vector 152. In particular, a given node 114 computes a cross-correlation between a generated voltage time series 146 and one or more voltage time series 146 received from other nodes 114 to determine a time offset between voltage fluctuations caused by the advancing edge of cloud 150. Based on this time offset and based on locations 148 of sites 140, nodes 114 can estimate wind vector 152. Based on the estimation of wind vector 152, any given node 114 can perform near-term solar forecasting in order to determine when electricity generated via solar panels is likely to change due to changes in solar irradiance caused by advancing clouds. Accordingly, a utility provider that supplies electricity to sites 140 can accurately scale electricity production in response to a predicted demand for electricity.

In the two-dimensional example illustrated in FIGS. 1B-1D, voltage time series 146(0) indicates a voltage fluctuation at node 114(0) at time $T_0$ caused by the advancing edge of cloud 150, as shown in FIG. 1C. Similarly, voltage time series 146(1) indicates a voltage fluctuation at node 114(1) at time $T_1$ caused by the further advancing edge of cloud 150, as shown in FIG. 1D. By cross-correlating voltage time series 146(0) and 146(1), either of nodes 114(0) and 114(1) can determine the time offset between times $T_0$ and $T_1$. Then, either of these nodes can estimate wind vector 152 relative to locations 148(0) and 148(1) of sites 140(0) and 140(1) to determine when cloud 150 will cause a reduction in solar power generation at other sites 140 that reside downwind of sites 140(0) and/or 140(1). With this anticipated reduction in solar power generation, the utility provider can predict an increase in demand for electricity and scale electricity production accordingly.

As mentioned, the above described process for estimating wind vector 152 depends on locations 148 of sites 140. The location of any given site 140 generally corresponds to the location of the associated node 114. Accordingly, the above-described process can be performed based on the locations of each node 114. When a given node 114 is installed, the location of that node is usually tabulated and reported to control center 130.

However, for various reasons, these locations are oftentimes reported inaccurately. For example, an installation technician could report only one location as corresponding to many nodes installed within a given area. Alternatively, the installation technician could simply enter the location data for a given node 114 incorrectly. As a general matter, the locations of nodes 114 are not necessarily accurate, potentially posing complications when the above-described process is performed. To address this particular issue, though, nodes 114 perform a technique for generating and improving location estimates for other nodes 114 based on voltage time series data and historical wind vectors. An exemplary node 114 configured to generate location estimates and estimate wind vectors is described in greater detail below in conjunction with FIGS. 2A-2C.

Figure 2A:
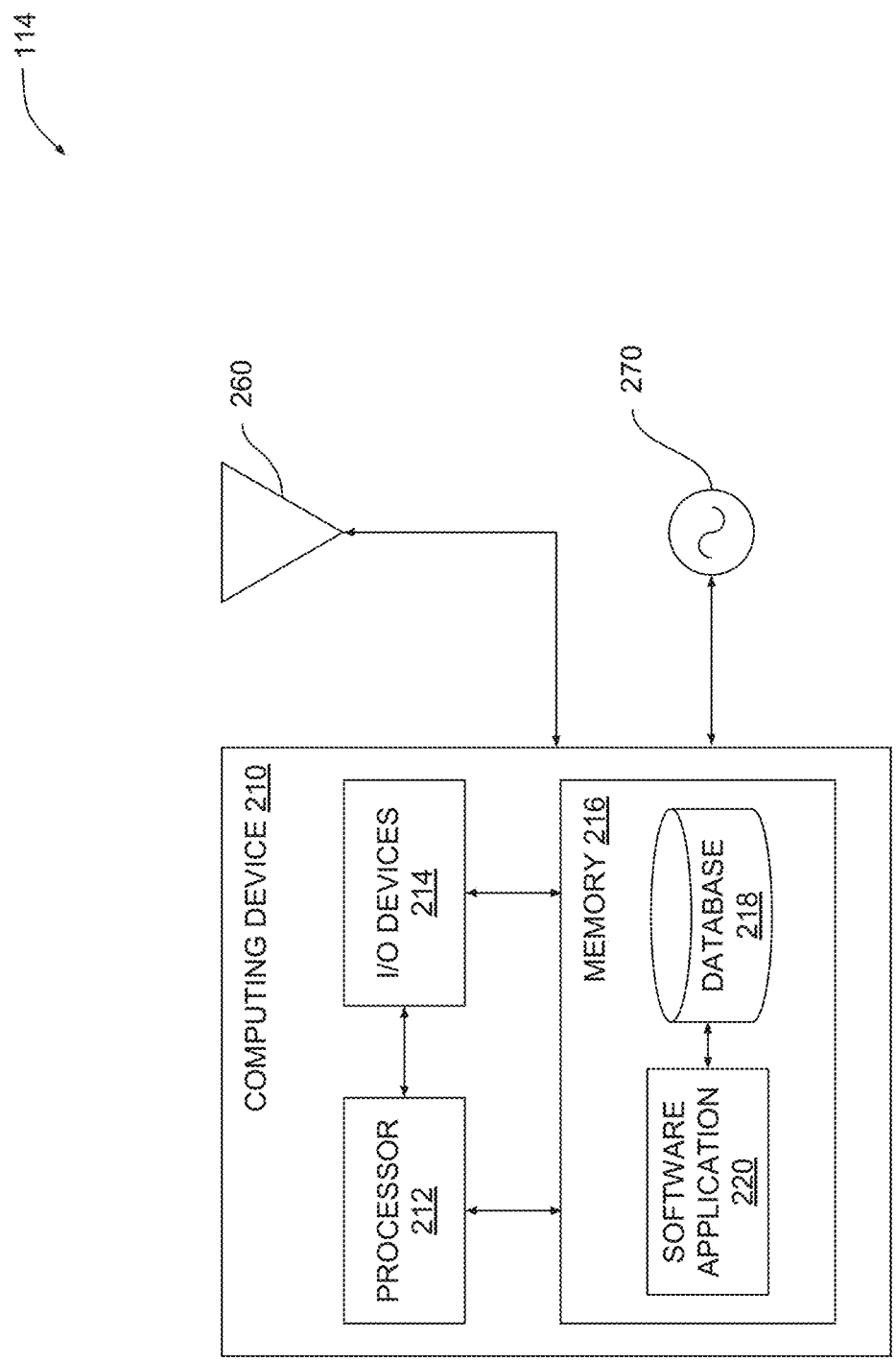
FIG. 2A illustrates a node that is configured to predict cloud movements and to estimate node locations, according to various embodiments of the present invention.

FIG. 2A illustrates a node that is configured to predict cloud movements and to estimate node locations, according to various embodiments of the present invention. As shown, a node 114 includes a computing device 210 coupled to a transceiver 260 and an oscillator 270. Computing device 210 coordinates the operations of node 114. Transceiver 260 is configured to transmit and receive data packets across network system 100 using a range of channels and power levels. Oscillator 270 provides one or more oscillation signals according to which the transmission and reception of data packets can be scheduled.

Computing device 210 includes a processor 212, input/output (I/O) devices 214, and memory 216, coupled together. Processor 212 may include any hardware configured to process data and execute software applications. Processor 212 may include a real-time clock (RTC) (not shown) according to which processor 212 maintains an estimate of the current time. The estimate of the current time may be expressed in Universal Coordinated Time (UTC), although any other standard of time measurement can also be used. I/O devices 214 include devices configured to receive input, devices configured to provide output, and devices configured to both receive input and provide output. Memory 216 may be implemented by any technically feasible storage medium.

Memory 216 includes a software application 220 and database 218, coupled together. Software application 220 includes program code that, when executed by processor 212, performs any of the node-oriented operations described herein. Those operations include coordinating the discovery process mentioned above, scheduling the transmission of data packets, and coordinating a hopping sequence, as described above in conjunction with FIG. 1A. In addition, software application 220 implements various software modules configured to perform the different techniques discussed above in conjunction with FIGS. 1B-1D. Those techniques include computing cross-correlations between voltage time series, estimating wind vectors, and estimating locations of other nodes. Software application 220 is described in greater detail below in conjunction with FIG. 2C.

Figure 2B:
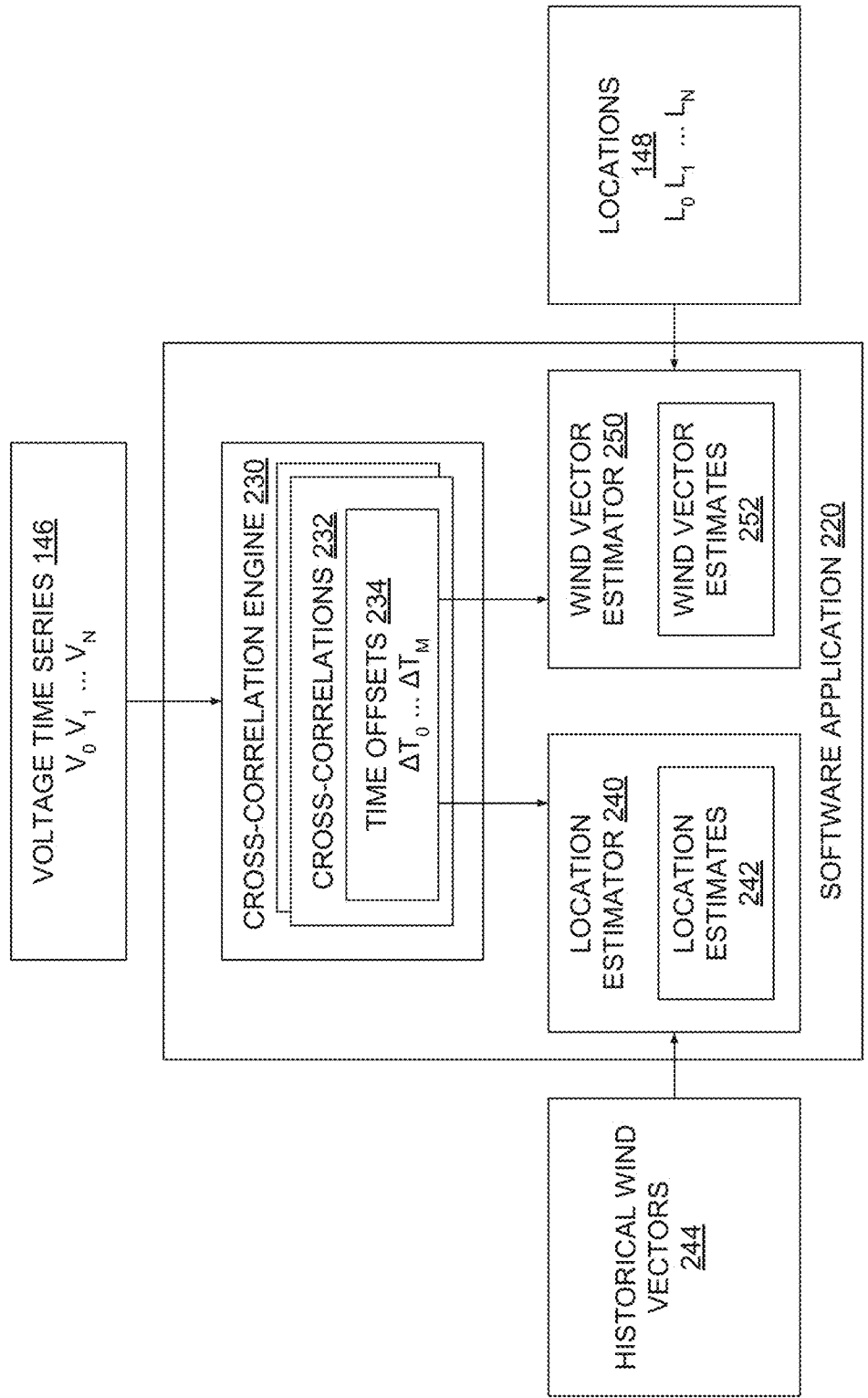
FIG. 2B is a more detailed illustration of the software application of FIG. 2A, according to various embodiments of the present invention.

FIG. 2B is a more detailed illustration of the software application of FIG. 2A, according to various embodiments of the present invention. As shown, software application 220 includes a cross-correlation engine 230, a location estimator 240, and a wind vector estimator 250. Cross-correlation engine 230 and location estimator 240 interoperate in order to generate and/or update estimates of the locations of other nodes. Cross-correlation engine 230 and wind vector estimator 250 interoperate to generate and/or update estimates of wind vectors that cause clouds to advance across a region where FAN 110 is deployed.

In operation, cross-correlation engine 230 obtains voltage time series 246 that includes voltage time series $V_0$ recorded at the node 114 as well as voltage time series $V_1$ through $V_N$ recorded at other nodes. Cross-correlation engine 230 performs a cross-correlation operation with different portions of $V_0$ and different portions of $V_1$ through $V_N$ to generate cross-correlations 232. A given cross-correlation 232 describes correlations between voltage fluctuations included in $V_0$ and voltage fluctuations included in one of $V_1$ through $V_N$. Based on cross-correlations 232, cross-correlation engine 230 generates time offsets 234 that include time offsets $\Delta T_0$ through $\Delta T_M$. A given time offset 234 indicates a time lag between voltage fluctuations included in $V_0$ and voltage fluctuations included in one of $V_1$ through $V_N$. Because voltage fluctuations measured at different nodes 114 may correlate at different time lags under different environmental conditions, time offsets 234 typically include many different time offsets 234 measured at different times for any pair of nodes 114. An exemplary cross-correlation 232 and time offset 234 are illustrated in FIG. 2C.

Figure 2C:
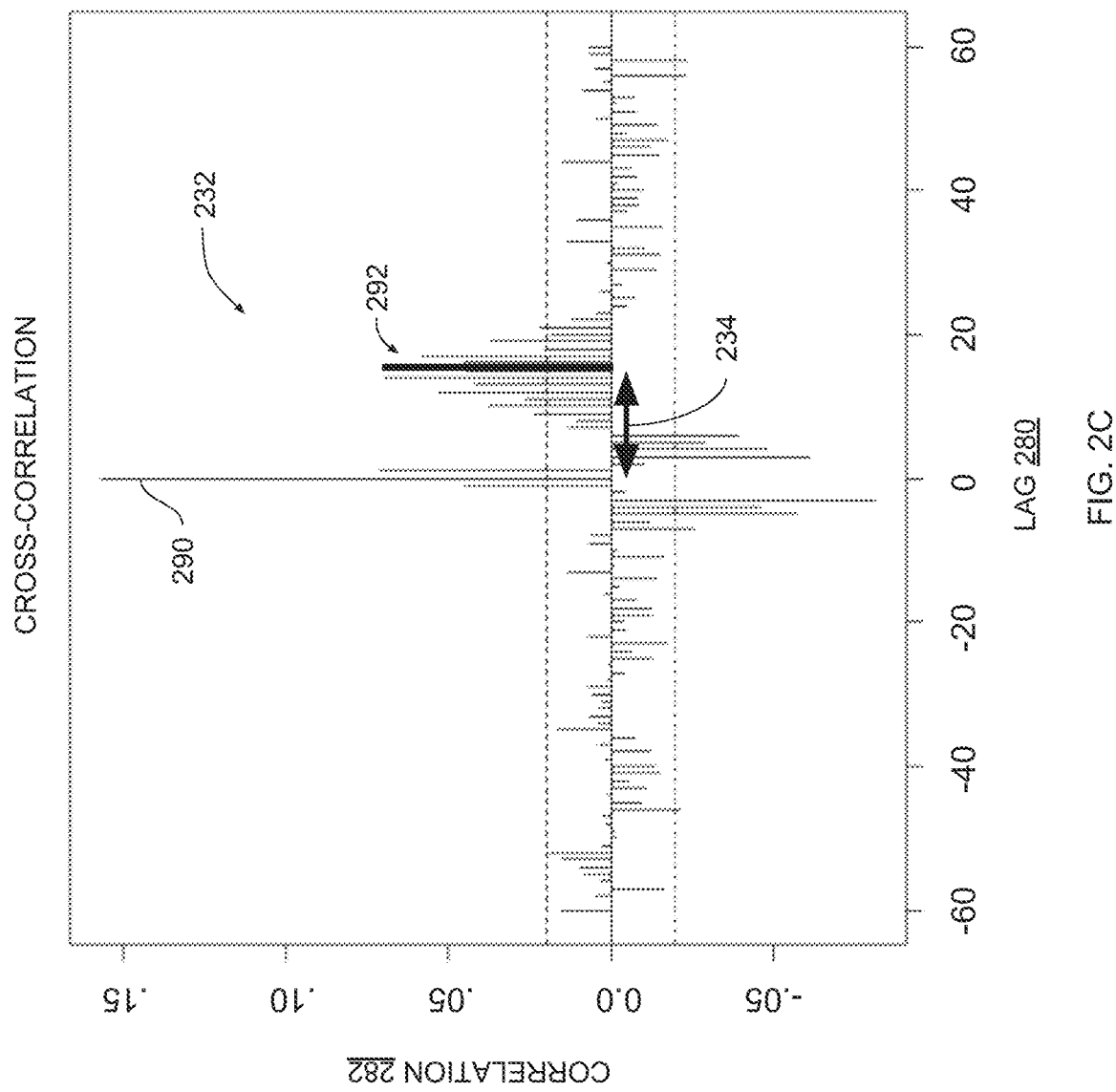
FIG. 2C is a more detailed illustration of one of the cross-correlations of FIG. 2B, according to various embodiments of the present invention.

FIG. 2C is a more detailed illustration of one of the cross-correlations of FIG. 2B, according to various embodiments of the present invention. As shown, a cross-correlation 232 is plotted against time lag axis 280 and correlation axis 282. Cross-correlation 232 includes a peak 290 disposed close to zero on time lag axis 280 that is derived from voltage fluctuations that affect network system 100 as a whole. Cross-correlation 232 also includes a peak 292 that is located at time offset 234 along time lag axis 280. In the example shown, an exemplary time offset 234 has a value of approximately 16 seconds, indicating that similar voltage fluctuations occur at different nodes 114 with a time delay of about 16 seconds. These voltage fluctuations could be caused, for example, by an advancing cloud cover that disrupts the generation of solar power, as described above in conjunction with FIGS. 1B-1D.

Referring back now to FIG. 2B, upon generating cross-correlation 232 and time offset 234, software application 220 may implement location estimator 240 and/or wind vector estimator 250, depending on whether locations 148 of nodes 114 are available. As mentioned, locations may not be available for various reasons, so software application 220 can estimate the locations of nodes 114 if needed.

Location estimator 240 analyzes time offsets 234 in conjunction with historical wind vectors 244 to generate location estimates 242. Historical wind vectors 244 includes measurements of wind direction and velocity recorded over a time period. Historical wind vectors 244 can be generated at one or more weather stations residing in a region where FAN 110 is deployed. Any given measurement included in historical wind vectors 244 that is gathered at a particular time may correspond to a specific time offset 234 generated at the same time.

In one embodiment, location estimator 240 may implement a Bayesian update algorithm to generate and then improve location estimates 242. In so doing, location estimator 240 generates a set of initial hypotheses of the locations of nodes 114 and then determines, for each hypothetical location, the probability of time offsets 234 and historical wind vectors 244. Location estimator 240 expresses these probabilities as a likelihood distribution over the set of hypothetical locations. Location estimator 240 repeats this operation iteratively with each measurement included in historical wind vectors 244 and a corresponding time offset 234 in order to improve the likelihood distribution. With each repetition, location estimator 240 computes a posterior probability for the location of nodes 114. Location estimator 240 performs this iterative process until all available data has been processed or until some convergence criterion has been met. This particular approach is described in greater detail below in conjunction with FIGS. 3A-4. Persons skilled in the art will understand that other approaches to estimating node locations based on time offsets also fall within the scope of the present invention.

Location estimator 240 performs the above approach to generating location estimates 242 periodically and on an as-needed basis. Location estimator 240 need not generate location estimates 242 when the locations of other nodes 114 are available. Specifically, when some or all locations 148 are available, wind vector estimator 250 can interoperate with cross-correlation engine 230 to generate wind vector estimates 252 without location estimator 240 generating location estimates 242.

Wind vector estimator 250 analyzes time offsets 234 generated by cross-correlation engine 230 in conjunction with locations 148. Locations 148 include location $L_0$ corresponding to the location of node 114 as well as locations $L_1$ through $L_N$ corresponding to other nodes 114 included in FAN 110. Locations 148 can be expressed as Global Positioning Service (GPS) coordinates, a local coordinate system, or a defined relative to a specifically selected node 114.

In one embodiment, wind vector estimator 250 may perform a triangulation operation with the positions of three or more nodes 114 and corresponding time offsets 234 in order to generate a wind vector estimate. Wind vector estimator 250 may perform the triangulation operation by converting locations 148 into a polar coordinate system and then performing a trigonometric analysis of the converted locations based on time offsets 234. In performing this technique, wind vector estimator 250 selects nodes 114 that do not reside collinearly to permit the triangulation operation to produce a deterministic result. This particular approach is described in greater detail below in conjunction with FIGS. 5A-6. Persons skilled in the art will understand that other approaches to estimating wind vectors based on time offsets also fall within the scope of the present invention.

Estimating Locations of Nodes

As mentioned above, location estimator 240 generates location estimates 242 under circumstances where locations 148 are either inaccurate or unavailable. In the embodiment described herein, location estimator 240 implements a Bayesian update algorithm that involves iteratively generating a likelihood distribution over a set of hypothetical locations for nodes 114 and then computing a posterior probability that nodes 114 reside at those locations. An example of how a given node 114 performs this technique to estimate the location of another node 114 is described below in conjunction with FIGS. 3A-3B.

Figure 3A:
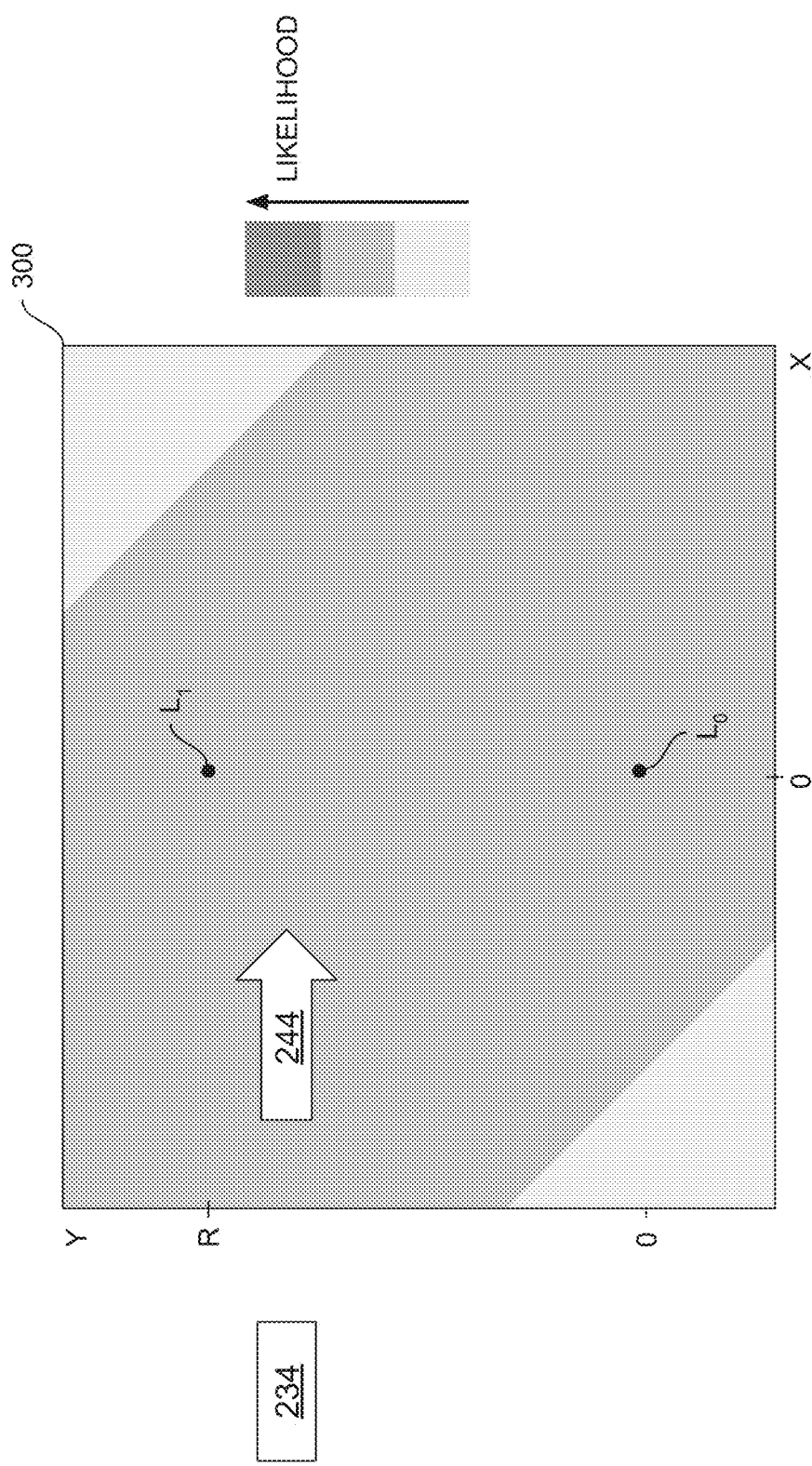
FIG. 3A illustrates a likelihood distribution associated with different hypothetical node locations, according to various embodiments of the present invention.

FIG. 3A illustrates a likelihood distribution associated with different hypothetical node locations, according to various embodiments of the present invention. As shown, a likelihood distribution 300 indicates locations $L_0$ and $L_1$.

Location $L_0$ is located at the origin of likelihood distribution 300 and corresponds to a pre-determined location of a node that is referred to in this example as the "origin node." Location $L_1$ is a hypothetical location that may be associated with another node that is referred to in this example as the "neighbor node." Initially, the location of the neighbor node is undetermined.

During a given iteration of the Bayesian update algorithm, the origin node analyzes a given time offset 234 in conjunction with a corresponding historical wind vector 244. The origin node then determines, across all locations within likelihood distribution 300 (including location $L_1$), the probability of the given time offset 234 and historical wind vector 244 occurring assuming that the neighbor node resides at those locations. Initially, likelihood distribution 300 may not be concentrated at any particular location, as is shown. Upon generating likelihood distribution 300, location estimator 240 then computes a posterior distribution that reflects the probability distribution of the neighbor node residing at each different location, as illustrated in FIG. 3B.

Figure 3B:
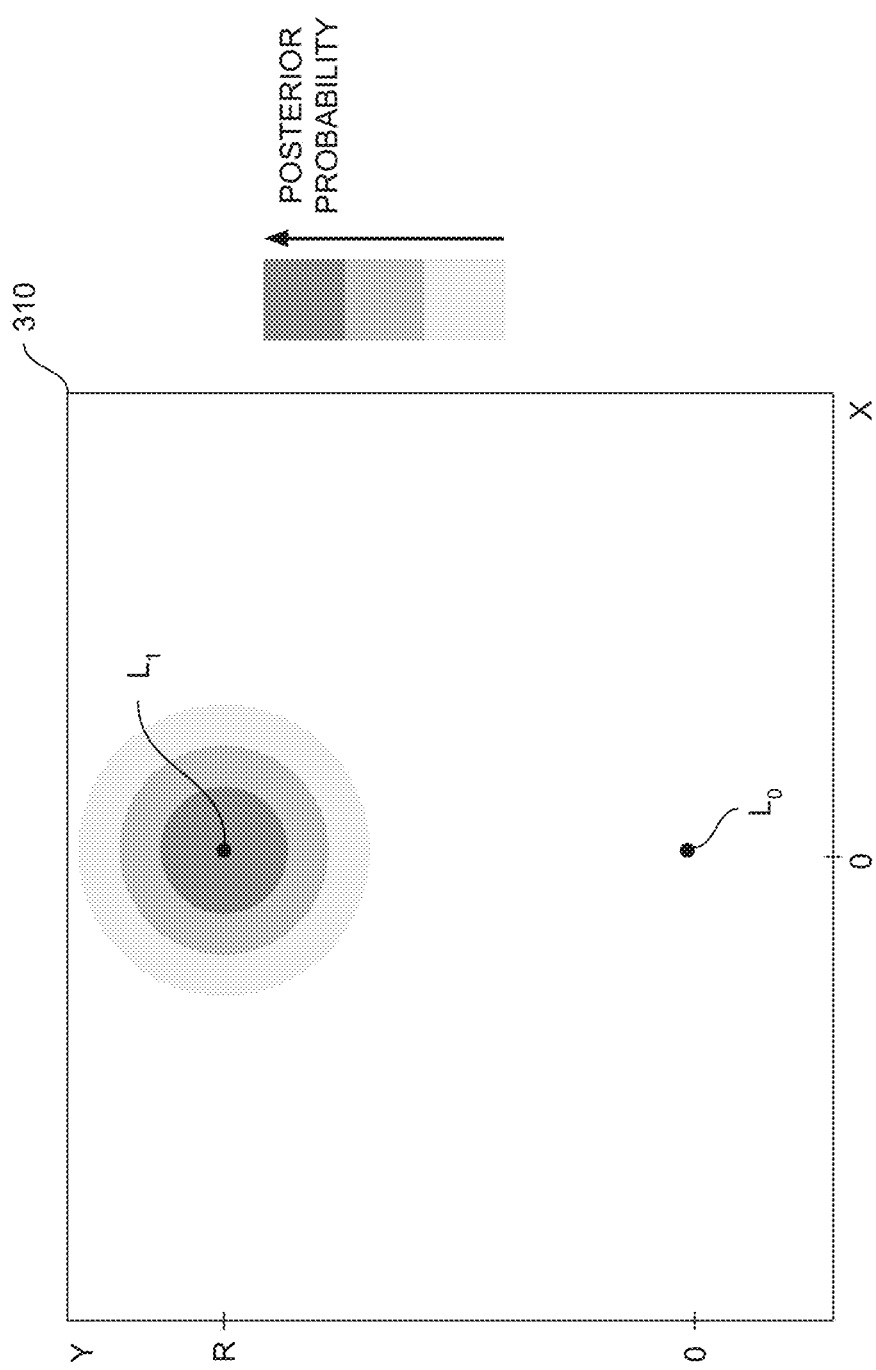
FIG. 3B illustrates a posterior probability distribution associated with different hypothetical node locations, according to various embodiments of the present invention.

FIG. 3B illustrates a posterior probability distribution associated with different hypothetical node locations, according to various embodiments of the present invention. Location estimator 240 computes posterior probability distribution 310 based on likelihood distribution 300 shown in FIG. 3A. Posterior probability distribution 310 indicates the probability that the neighbor node resides at each location. As is shown, the probability that the neighbor node resides at location $L_1$ is very high.

Referring generally to FIGS. 3A-3B, location estimator 240 performs the operations discussed in conjunction with these Figures iteratively for each time offset 234 that is generated for the origin node and the neighbor node. With each iteration, location estimator 240 improves the likelihood distribution and the posterior probability distribution until all data is processed or until a convergence criterion is met. Then, location estimator 240 outputs a location estimate 242 for the neighbor node. The above-described process is also described below in conjunction with FIG. 4.

Figure 4:
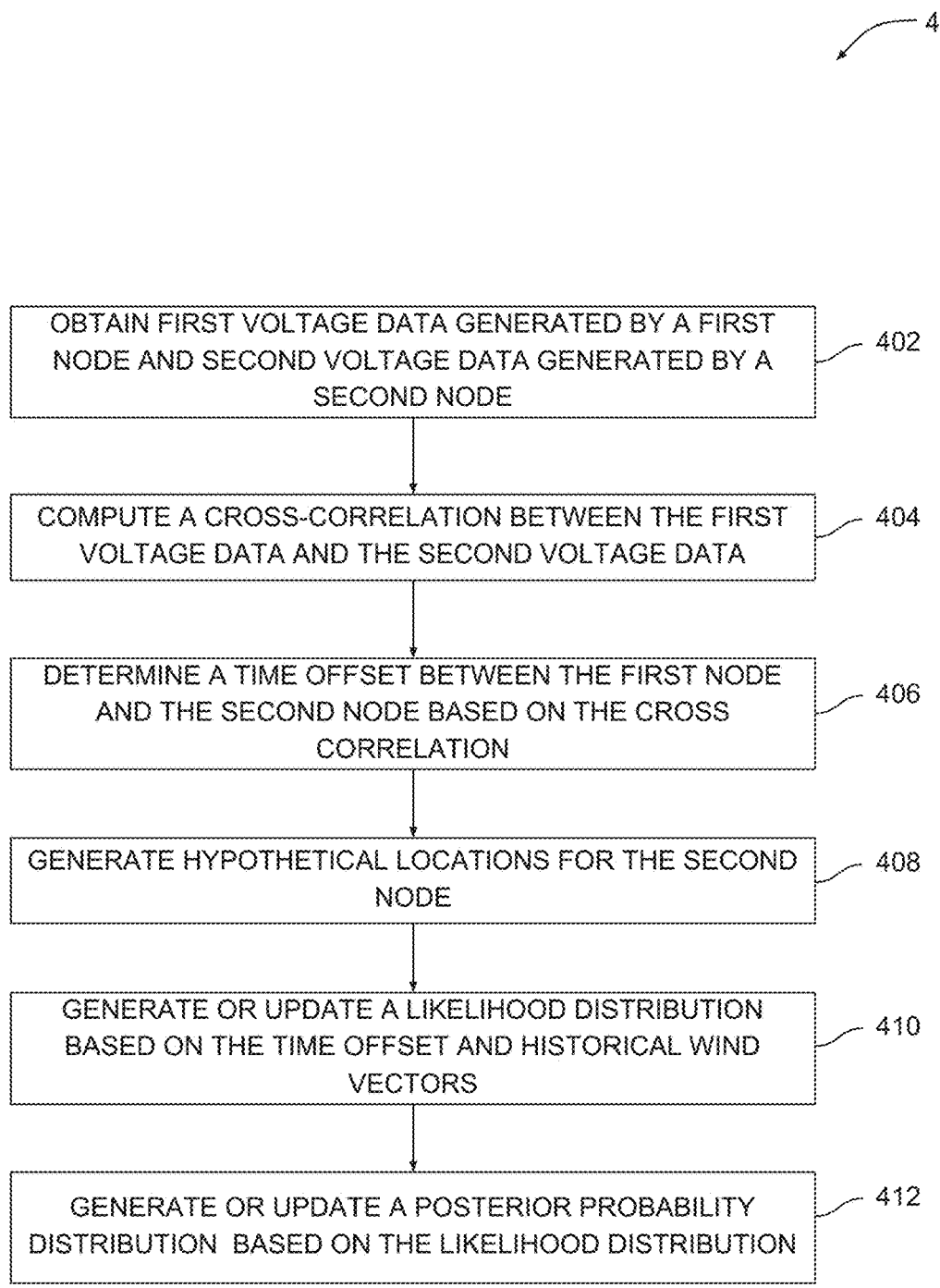
FIG. 4 is a flow diagram of method steps for estimating the location of a node that resides within a network system, according to various embodiments of the present invention.

FIG. 4 is a flow diagram of method steps for estimating the location of a node that resides within a network system, according to various embodiments of the present invention. Although the method steps are described in conjunction with the systems of FIGS. 1-3B, persons skilled in the art will understand that any system configured to perform the method steps in any order falls within the scope of the present invention.

As shown, a method 400 begins at step 402, where a first node obtains first voltage data generated at the first node as well as second voltage data generated by a second node. The first and second voltage data indicates voltage fluctuations that occur over time. These voltage fluctuations can originate within an electricity distribution infrastructure to which the first and second nodes are coupled, and can also originate at locations where the first and second nodes are coupled. In an example of the latter case, the first and second nodes could be deployed at locations where solar power is generated intermittently, causing fluctuations in voltage load.

At step 404, the first node computes a cross-correlation between the first voltage data and the second voltage data. The cross-correlation indicates some voltage fluctuations that occur at the first and second node nearly simultaneously. These voltage fluctuations originate within the electricity distribution infrastructure. The cross-correlation also indicates other voltage fluctuations that occur at the first and second node with a particular time offset. These voltage fluctuations are caused by an advancing cloud edge that triggers a voltage fluctuation at the first node at a different time than a similar voltage fluctuation is triggered at the second node.

At step 406, the first node determines a time offset between the first node and the second node based on the cross correlation. The time offset represents the time needed for the advancing cloud to cover the distance between the first node and the second node. In one embodiment, the first node analyzes the cross correlation generated at step 404 and removes correlation peaks associated with a time offset that is less than a threshold value, thereby eliminating peaks that are not caused by the advancing cloud.

At step 408, the first node generates a set of hypothetical locations for the second node. The first node could generate the hypothetical locations based on predetermined boundaries of a region where the first node and the second node are deployed, for example. Alternatively, the first node could generate the hypothetical locations based on a received signal strength of the second node, a single-to-noise ratio of the second node, or a transmission delay associated with the second node, among other data.

At step 410, the first node generates or updates a likelihood distribution based on the time offset and based on historical wind vectors. The historical wind vectors indicate the direction and velocity of wind at different times. The historical wind vectors could be recorded at a nearby weather station, for example. The first node generates the likelihood distribution by computing the probability of each time offset and corresponding historical wind vector assuming that the second node resides at each different hypothetical location.

At step 412, the first node generates or update a posterior probability distribution based on the likelihood distribution. The posterior probability distribution represents the probability of the second node residing at each of the different hypothetical locations generated at step 408. The first node performs steps 410 and 412 iteratively in order to improve the likelihood distribution and the posterior probability distribution until all available data has been processed or a convergence criterion is met. The first node then outputs a location estimate 242 for the second node. In one embodiment, control center 130 performs the method 400 based on data collected from nodes 114.

According to the techniques described above in conjunction with FIGS. 3A-4, any given node 114 can estimate the locations of other nodes 114 based on time offsets 234 and historical wind vectors 244. These techniques advantageously provide nodes 114 with the ability to generate location estimates when the locations of other nodes are inaccurate or unavailable. Once the locations of other nodes 114 are known with some degree of accuracy, nodes 114 can then generate estimates of wind vectors for the purposes of performing near-term solar forecasting, as described below in conjunction with FIGS. 5A-6.

Estimating Wind Direction and Magnitude

As previously described, wind vector estimator 250 generates wind vector estimates 252 based on locations 148. In the embodiment described herein, wind vector estimator 250 performs various trigonometric operations associated with a triangulation operation in order to determine a given wind vector estimate 252. An example of how a given node 114 performs this technique to estimate a wind vector is described below in conjunction with FIGS. 5A-5B.

Figure 5A:
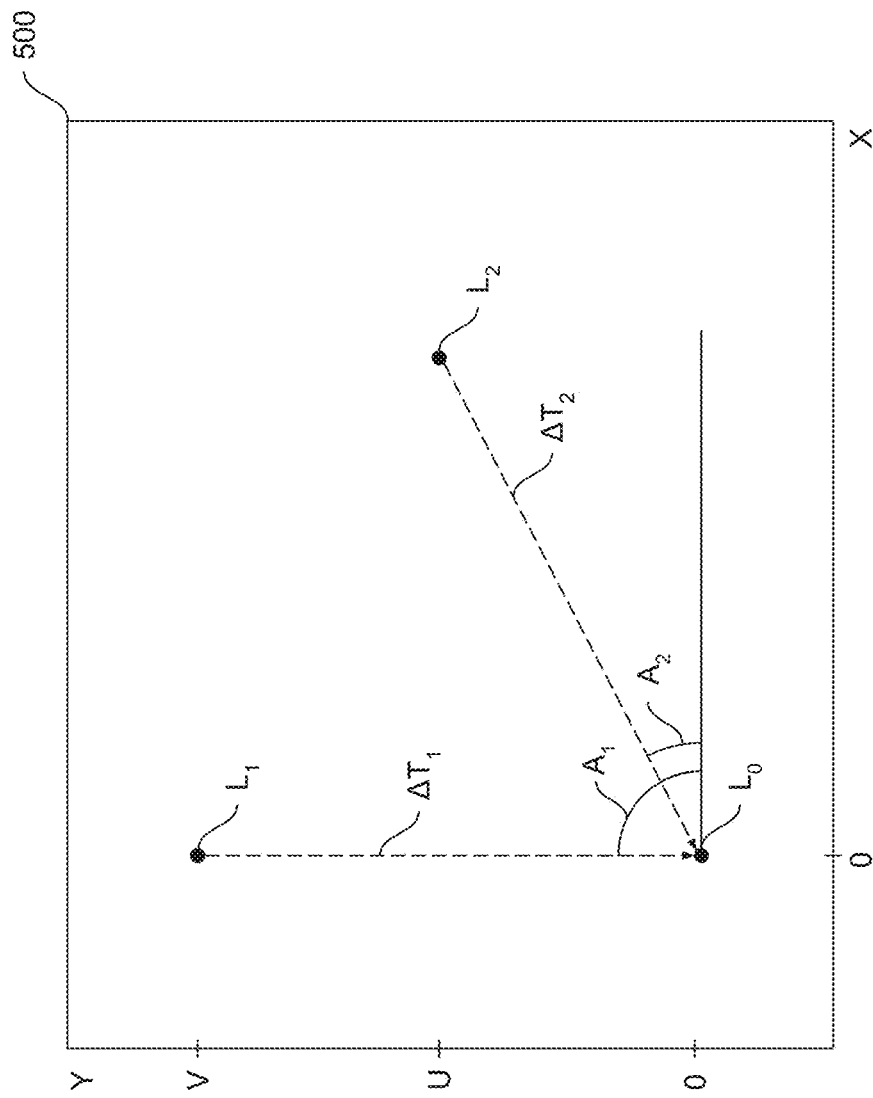
FIG. 5A illustrates a group of nodes that reside within the network system of FIG. 1, according to various embodiments of the present invention.

FIG. 5A illustrates how a group of nodes estimates a wind vector, according to various embodiments of the present invention. As shown, a region 500 includes locations $L_0$, $L_1$, and $L_2$. Location $L_0$ corresponds to the origin of region 500 and represents a location occupied by a node that is referred to herein as the "origin node." The origin node generates an estimate for a wind vector based on various data associated with neighboring nodes that reside at locations $L_1$ and $L_2$. In particular, the origin node determines a time offset $\Delta T_1$ and an angle $A_1$ relative to a neighboring node that resides at location $L_1$ along with a time offset $\Delta T_2$ and an angle $A_2$ relative to a neighboring node that resides at location $L_2$. Based on this data, the origin node performs a triangulation operation to determine a wind vector estimate 252. Wind vector estimate 252 generated via the triangulation operation is shown in FIG. 5B.

Figure 5B:
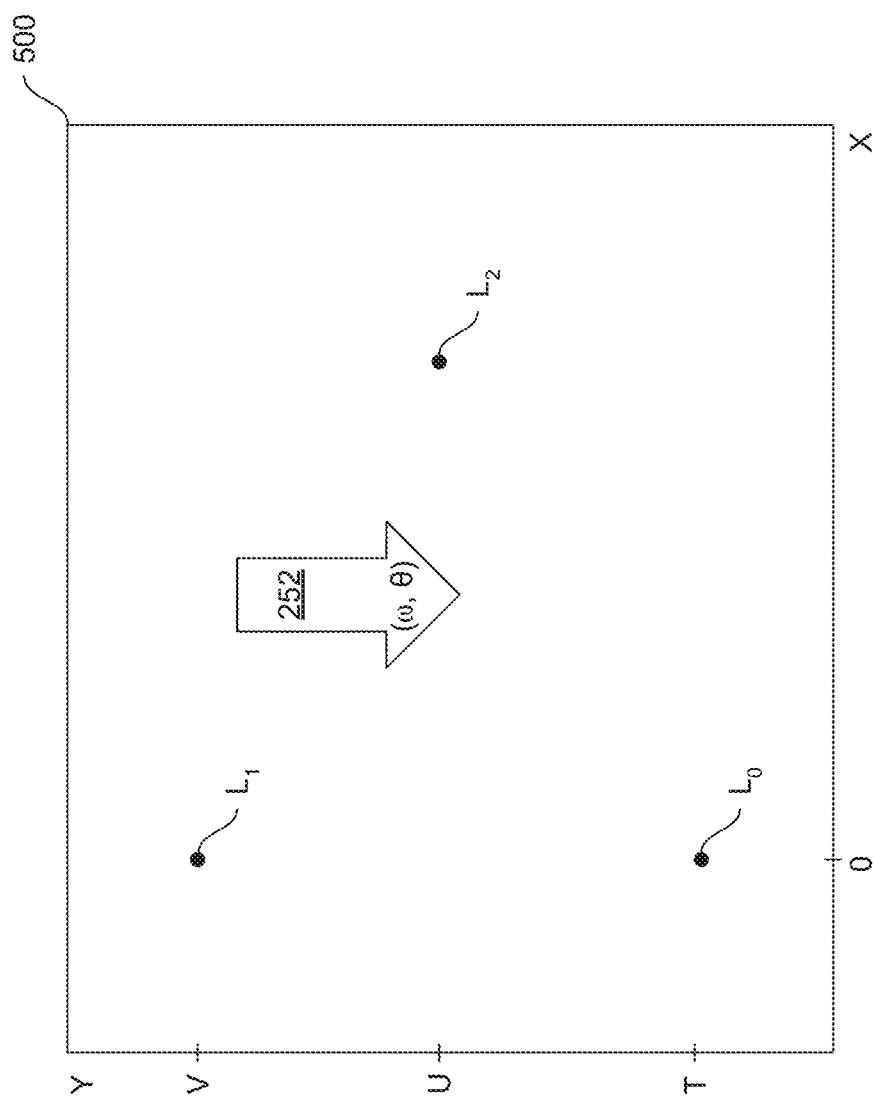
FIG. 5B illustrates how the nodes of FIG. 5A interoperate to estimate a wind vector, according to various embodiments of the present invention.

FIG. 5B illustrates a wind vector estimated by the group of nodes of FIG. 5A, according to various embodiments of the present invention. As shown, wind vector 252 describes a current velocity ($\omega$) and direction ($\theta$) associated with wind. As discussed above in conjunction with FIGS. 1B-1D, wind causes clouds to advance over nodes 114 and disrupt electricity generation via solar panels. By estimating the direction and velocity of this wind, future disruptions can be anticipated, allowing utility providers to scale electricity production accordingly.

Referring generally to FIGS. 5A-5B, persons skilled in the art will understand that triangulation is a well-known trigonometric technique for determining various data based on triangles. Accordingly, triangulation is not discussed in greater detail herein. In addition, persons skilled in the art will understand that other techniques for estimating a vector based on time offsets and positions can also be applied to generate wind vector 252, and that those other techniques also fall within the scope of the present invention. The operation of wind vector estimator 250 is further described below in conjunction with FIG. 6.

Figure 6:
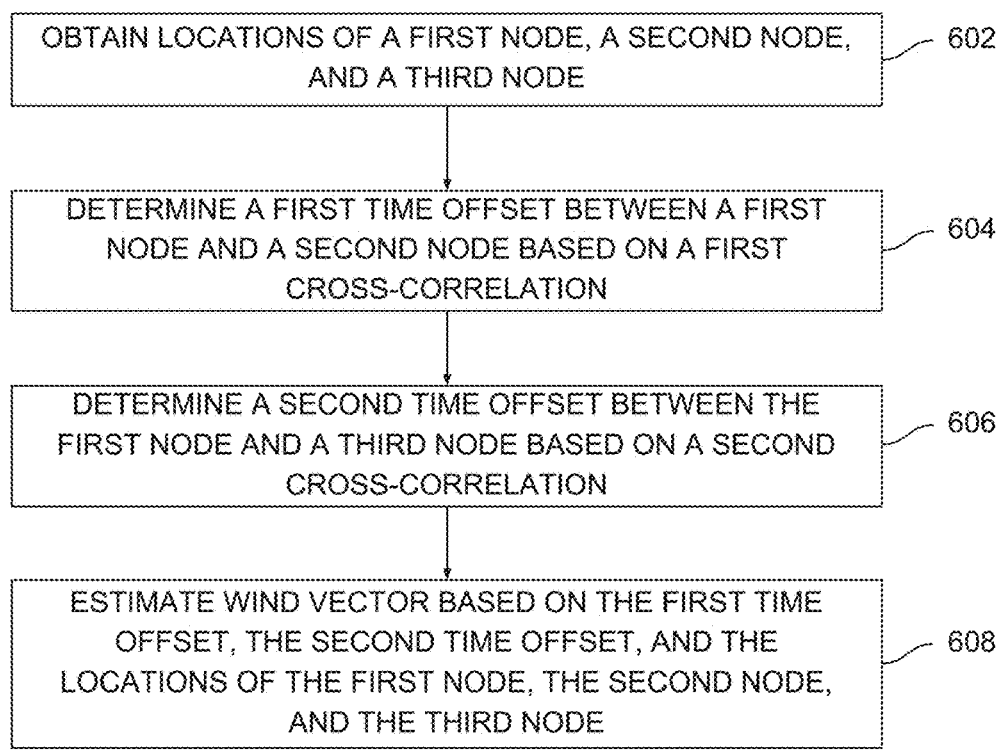
FIG. 6 is a flow diagram of method steps for estimating a wind vector at a node that resides within a network system, according to various embodiments of the present invention.

FIG. 6 is a flow diagram of method steps for estimating a wind vector at a node that resides within a network system, according to various embodiments of the present invention. Although the method steps are described in conjunction with the systems of FIGS. 1-2C and 5A-5B, persons skilled in the art will understand that any system configured to perform the method steps in any order falls within the scope of the present invention.

A show, a method 600 begins at step 602, where a first node obtains the locations of the first node, a second node, and a third node. The first node may or may not have accurate location data for any of the first, second, or third nodes. If such data is unavailable or inaccurate, then the first node can perform the techniques described above in conjunction with FIGS. 3A-4 to determine these locations or cause another node to perform those techniques to determine the needed locations.

At step 604, the first node determines a first time offset between the first node and the second node based on a first cross-correlation. The first node generates first voltage time series data based on measurements of a connected power line. The first node obtains second voltage time series data from the second node that is generated by the second node in a similar manner. The first node cross-correlates the first voltage time series with the second voltage time series in the manner described above in conjunction with FIG. 2C to determine the first time offset. The first time offset represents a time difference between the occurrence of voltage fluctuations included in the first voltage time series and corresponding voltage fluctuations included in the second voltage time series.

At step 606, the first node determines a second time offset between the first node and the third node based on a second cross-correlation. The first node obtains third voltage time series data from the third node and then cross-correlates the first voltage time series with the second voltage time series. Based on this cross-correlation, the first node determines the second time offset, in like fashion as described in conjunction with step 604. The second time offset represents a time difference between the occurrence of voltage fluctuations included in the first voltage time series and corresponding voltage fluctuations included in the third voltage time series.

At step 608, the first node estimates a wind vector based on the first time offset, the second time offset, and the locations of the first node, the second node, and the third node. In so doing, the first node executes various trigonometric operations associated with triangulation. The estimate of the wind vector can be used to determine when an advancing cloud will disrupt solar power generation at different locations, thereby allowing the utility provider to predict future demand for electricity and scale electricity production accordingly. In this manner, utility providers can deliver electricity to consumers more effectively and with greater efficiency. In one embodiment, control center 130 performs the method 600 based on data collected from nodes 114.

In sum, a wireless mesh network includes a group of nodes configured to predict cloud movements based on voltage time series data. A node residing in the wireless mesh network records voltage fluctuations at a site where solar power is generated. The voltage fluctuations occur when an advancing cloud reduces solar irradiance at the site and reduces solar power generation. The node correlates these voltage fluctuations with other voltage fluctuations recorded by other nodes at other sites where solar power is generated. The node computes a time offset between these voltage fluctuations. The time offset corresponds to the time needed for the cloud to advance between the different sites. Based on this time offset and the locations of the various nodes, the node estimates a wind vector. The wind vector can be used to perform near-term solar forecasting by predicting when the cloud will advance to other sites and reduce solar power generation at those other sites. The node can also estimate the location of the other nodes, if needed, based on the time offset and historical weather information.

At least one technological advantage of the disclosed techniques relative to the prior art is that a utility provider can anticipate demand for electricity based on real-time predictions of current weather conditions. Accordingly, the utility provided can scale electricity production to meet the anticipated demand, thereby improving the efficiency with which electricity is provided to consumers. Another technological advantage of the disclosed techniques is that nodes can determine the locations of other nodes in situations where the locations of other nodes are unknown or inaccurate, thereby facilitating the prediction of real-time weather conditions. These technological advantages represent one or more technological advancements over prior art approaches.

1. Some embodiments include a computer-implemented method for near-term solar forecasting via a network of nodes, the method comprising measuring, at a first node, a first plurality of voltage fluctuations within a first power line to generate a first voltage time series, wherein the first node resides at a first location within the network and is coupled to the first power line, and one or more of the voltage fluctuations occur in response to changes in solar irradiance at the first location, generating, at the first node, a first cross-correlation between the first voltage time series and a second voltage time series generated by a second node, wherein the second nodes resides at a second location within the network and communicates with the first node via the network, determining, at the first node, a first time offset based on the first cross-correlation, wherein the first time offset indicates a first delay between a first voltage fluctuation included in the first voltage time series and a second voltage fluctuation included in the second voltage time series, and computing, at the first node, a first wind vector based on the first location, the second location, and the first time offset, wherein the first wind vector indicates one or more points in time when solar power generation decreases at one or more locations within the network.

2. The computer-implemented method of clause 1, further comprising generating a second cross-correlation between the first voltage time series and a third voltage time series associated with a third node within the network, and determining a second time offset based on the second cross-correlation, wherein the second time offset indicates a second delay between the first voltage fluctuation and a third voltage fluctuation included in the second voltage time series, wherein the first wind vector is further computed based on a third location where the third node resides and the second time offset, and wherein computing the first wind vector comprises performing a triangulation operation with the first time offset and the second time offset based on the first location, the second location, and the third location.

3. The computer-implemented method of any of clauses 1-2, further comprising determining the first location by obtaining a first historical wind vector generated by a weather station, generating a second time offset based on a set of additional voltage time series associated with the first node and the second node, generating a plurality of hypothetical locations associated with the first node based on the second time offset, generating a first probability distribution based on the first historical wind vector, the second time offset, and the plurality of hypothetical locations, wherein the first probability distribution indicates different probabilities of the first node residing at each of the different hypothetical locations, and selecting a first hypothetical location included in the plurality of hypothetical locations and having a first probability value that exceeds all other probability values associated with all other hypothetical locations included in the plurality of hypothetical locations.

4. The computer-implemented method of any of clauses 1-3, wherein the first voltage fluctuation occurs when a first solar panel output is modified at the first location, and the second voltage fluctuation occurs when a second solar panel output is modified at the second location.

5. The computer-implemented method of any of clauses 1-4, wherein the first solar panel output is modified in response to a first cloud modifying solar irradiance at the first location, and the second solar panel output is modified in response to the first cloud modifying solar irradiance at the second location.

6. The computer-implemented method of any of clauses 1-5, wherein the first cloud moves between the first location and the second location with a direction and velocity that corresponds to the first wind vector.

7. The computer-implemented method of any of clauses 1-6, wherein the first node generates the first voltage time series when measuring electricity consumption at the first location, and the second node generates the second voltage time series when measuring electricity consumption at the second location.

8. The computer-implemented method of any of clauses 1-7, wherein the network comprises a wireless mesh network, and further comprising transmitting the first voltage time series to the second node via the wireless mesh network.

9. The computer-implemented method of any of clauses 1-8, further comprising predicting, based on the first wind vector, a first point in time when solar power generation at a third location should change, and modifying the amount of electrical power available at the third location before the first point in time.

10. The computer-implemented method of any of clauses 1-9, wherein solar power generation changes at the third location when at least one wind current causes the first cloud to traverse the third location and modify solar irradiance at the third location.

11. Some embodiments include a non-transitory computer-readable medium storing program instructions that, when executed by a processor, causes the processor to perform near-term solar forecasting via a network of nodes by performing the steps of measuring, at a first node, a first plurality of voltage fluctuations within a first power line to generate a first voltage time series, wherein the first node resides at a first location within the network and is coupled to the first power line, and one or more of the voltage fluctuations occur in response to changes in solar irradiance at the first location, generating, at the first node, a first cross-correlation between the first voltage time series and a second voltage time series generated by a second node, wherein the second nodes resides at a second location within the network and communicates with the first node via the network, determining, at the first node, a first time offset based on the first cross-correlation, wherein the first time offset indicates a first delay between a first voltage fluctuation included in the first voltage time series and a second voltage fluctuation included in the second voltage time series, and computing, at the first node, a first wind vector based on the first location, the second location, and the first time offset, wherein the first wind vector indicates one or more points in time when solar power generation decreases at one or more locations within the network.

12. The non-transitory computer-readable medium of clause 11, further comprising the steps of generating a second cross-correlation between the first voltage time series and a third voltage time series associated with a third node within the network, and determining a second time offset based on the second cross-correlation, wherein the second time offset indicates a second delay between the first voltage fluctuation and a third voltage fluctuation included in the second voltage time series, wherein the first wind vector is further computed based on a third location where the third node resides and the second time offset.

13. The non-transitory computer-readable medium of any of clauses 11-12, wherein the step of computing the first wind vector comprises performing a triangulation operation with the first time offset and the second time offset based on the first location, the second location, and the third location.

14. The non-transitory computer-readable medium of any of clauses 11-13, further comprising the step of determining the first location by obtaining a first historical wind vector generated by a weather station, generating a second time offset based on a set of additional voltage time series associated with the first node and the second node, generating a plurality of hypothetical locations associated with the first node based on the second time offset, generating a first probability distribution based on the first historical wind vector, the second time offset, and the plurality of hypothetical locations, wherein the first probability distribution indicates different probabilities of the first node residing at each of the different hypothetical locations, and selecting a first hypothetical location included in the plurality of hypothetical locations and having a first probability value that exceeds all other probability values associated with all other hypothetical locations included in the plurality of hypothetical locations.

15. The non-transitory computer-readable medium of any of clauses 11-14, wherein generating the first probability distribution comprises generating a likelihood distribution for the plurality of hypothetical locations, wherein the likelihood distribution indicates, for the first hypothetical location, a probability of the first historical wind vector occurring in conjunction with the second time offset when the first node resides at the first hypothetical location, and generating a posterior probability distribution that includes the first probability value based on the likelihood distribution.

16. The non-transitory computer-readable medium of any of clauses 11-15, wherein the second time offset is generated based on a second cross-correlation between a third voltage time series associated with the first node and a fourth voltage time series associated with the second node.

17. The non-transitory computer-readable medium of any of clauses 11-16, wherein the step of determining the first time offset comprises analyzing the first cross-correlation to determine a plurality of peaks, identifying a first peak included in the plurality of peaks that resides at least a threshold distance away from an origin of the first cross-correlation, and determining the first time offset based on the first peak.

18. The non-transitory computer-readable medium of any of clauses 11-17, wherein the first voltage fluctuation occurs when a first solar panel output is modified at the first location, and the second voltage fluctuation occurs when a second solar panel output is modified at the second location, wherein the first solar panel output is modified in response to a first cloud modifying solar irradiance at the first location, and the second solar panel output is modified in response to the first cloud modifying solar irradiance at the second location.

19. The non-transitory computer-readable medium of any of clauses 11-18, wherein the first cloud moves between the first location and the second location with a direction and velocity that corresponds to the first wind vector.

20. Some embodiments include a system, comprising a first node that resides at a first location within a network and performs the steps of measuring a first plurality of voltage fluctuations within a first power line to generate a first voltage time series, wherein the first node is coupled to the first power line, and one or more of the voltage fluctuations occur in response to changes in solar irradiance at the first location, generating a first cross-correlation between the first voltage time series and a second voltage time series, determining a first time offset based on the first cross-correlation, wherein the first time offset indicates a first delay between a first voltage fluctuation included in the first voltage time series and a second voltage fluctuation included in the second voltage time series, and computing a first wind vector based on the first location, the second location, and the first time offset, wherein the first wind vector indicates one or more points in time when solar power generation decreases at one or more locations within the network, and a second node that resides at a second location within the network and performs the steps of measuring a second plurality of voltage fluctuations within a second power line to generate the second voltage time series, wherein the second node is coupled to the second power line, and transmitting the second voltage time series to the first node across the network.

Any and all combinations of any of the claim elements recited in any of the claims and/or any elements described in this application, in any fashion, fall within the contemplated scope of the present invention and protection.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method or computer program product. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine. The instructions, when executed via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable gate arrays.

The flowchart and block diagrams in the figures illustrate the architecture, functionality, and operation of possible implementations of systems, methods and computer program products according to various embodiments of the present invention of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preceding is directed to embodiments of the present disclosure, other and further embodiments of the disclosure may be devised without departing from the basic scope thereof, and the scope thereof is determined by the claims that follow.

What is claimed is:

1. A computer-implemented method for near-term solar forecasting via a network of nodes, the method comprising:
   measuring, via one or more sensors associated with a first node, a first plurality of voltage fluctuations within a first power line to generate a first voltage time series, wherein the first node resides at a first location within the network where power is generated from sunlight, the first node is coupled to the first power line, and one or more of the voltage fluctuations occur in response to changes in solar irradiance at the first location;
   generating, at the first node, a first cross-correlation between the first voltage time series and a second voltage time series generated by a second node, wherein the second node resides at a second location within the network where power is generated from sunlight, and the second node communicates with the first node via the network;
   determining, at the first node, a first time offset based on the first cross-correlation, wherein the first time offset indicates a first delay between a first voltage fluctuation included in the first voltage time series and a second voltage fluctuation included in the second voltage time series; and
   computing, at the first node, a first wind vector based on the first location, the second location, and the first time offset, wherein the first wind vector indicates one or more points in time when solar power generation decreases at one or more locations within the network.

2. The computer-implemented method of claim 1, further comprising:
   generating a second cross-correlation between the first voltage time series and a third voltage time series associated with a third node within the network; and
   determining a second time offset based on the second cross-correlation, wherein the second time offset indicates a second delay between the first voltage fluctuation and a third voltage fluctuation included in the third voltage time series,
   wherein the first wind vector is further computed based on a third location where the third node resides and the second time offset, and wherein computing the first wind vector comprises performing a triangulation operation with the first time offset and the second time offset based on the first location, the second location, and the third location.

3. The computer-implemented method of claim 1, further comprising determining the first location by:
   obtaining a first historical wind vector generated by a weather station;
   generating a second time offset based on a set of additional voltage time series associated with the first node and the second node;
   generating a plurality of hypothetical locations associated with the first node based on the second time offset;
   generating a first probability distribution based on the first historical wind vector, the second time offset, and the plurality of hypothetical locations, wherein the first probability distribution indicates different probabilities of the first node residing at each of the different hypothetical locations; and
   selecting a first hypothetical location included in the plurality of hypothetical locations and having a first probability value that exceeds all other probability values associated with all other hypothetical locations included in the plurality of hypothetical locations.

4. The computer-implemented method of claim 1, wherein the first voltage fluctuation occurs when a first solar panel output is modified at the first location, and the second voltage fluctuation occurs when a second solar panel output is modified at the second location.

5. The computer-implemented method of claim 4, wherein the first solar panel output is modified in response to a first cloud modifying solar irradiance at the first location, and the second solar panel output is modified in response to the first cloud modifying solar irradiance at the second location.

6. The computer-implemented method of claim 4, wherein the first wind vector indicates a direction and a velocity of a first cloud that moves between the first location and the second location.

7. The computer-implemented method of claim 1, wherein the first node generates the first voltage time series when the one or more sensors measure electricity consumption at the first location, and the second node generates the second voltage time series when one or more additional sensors associated with the second node measure electricity consumption at the second location.

8. The computer-implemented method of claim 1, wherein the network comprises a wireless mesh network, and further comprising transmitting the first voltage time series to the second node via the wireless mesh network.

9. The computer-implemented method of claim 1, further comprising:
   predicting, based on the first wind vector, a first point in time when solar power generation at a third location should change; and
   modifying the amount of electrical power available at the third location before the first point in time.

10. The computer-implemented method of claim 9, wherein solar power generation changes at the third location when at least one wind current causes the first cloud to traverse the third location and modify solar irradiance at the third location.

11. A non-transitory computer-readable medium storing program instructions that, when executed by a processor, causes the processor to perform near-term solar forecasting via a network of nodes by performing the steps of:
   measuring, via one or more sensors associated with a first node, a first plurality of voltage fluctuations within a first power line to generate a first voltage time series, wherein the first node resides at a first location within the network where power is generated from sunlight, the first node is coupled to the first power line, and one or more of the voltage fluctuations occur in response to changes in solar irradiance at the first location;

generating, at the first node, a first cross-correlation between the first voltage time series and a second voltage time series generated by a second node, wherein the second node resides at a second location within the network where power is generated from sunlight, and the second node communicates with the first node via the network;

determining, at the first node, a first time offset based on the first cross-correlation, wherein the first time offset indicates a first delay between a first voltage fluctuation included in the first voltage time series and a second voltage fluctuation included in the second voltage time series; and computing, at the first node, a first wind vector based on the first location, the second location, and the first time offset, wherein the first wind vector indicates one or more points in time when solar power generation decreases at one or more locations within the network.

12. The non-transitory computer-readable medium of claim 11, wherein the steps further comprise:

generating a second cross-correlation between the first voltage time series and a third voltage time series associated with a third node within the network; and determining a second time offset based on the second cross-correlation, wherein the second time offset indicates a second delay between the first voltage fluctuation and a third voltage fluctuation included in the third voltage time series, wherein the first wind vector is further computed based on a third location where the third node resides and the second time offset.

13. The non-transitory computer-readable medium of claim 12, wherein the step of computing the first wind vector comprises performing a triangulation operation with the first time offset and the second time offset based on the first location, the second location, and the third location.

14. The non-transitory computer-readable medium of claim 11, wherein the steps further comprise determining the first location by:

obtaining a first historical wind vector generated by a weather station;

generating a second time offset based on a set of additional voltage time series associated with the first node and the second node;

generating a plurality of hypothetical locations associated with the first node based on the second time offset;

generating a first probability distribution based on the first historical wind vector, the second time offset, and the plurality of hypothetical locations, wherein the first probability distribution indicates different probabilities of the first node residing at each of the different hypothetical locations; and selecting a first hypothetical location included in the plurality of hypothetical locations and having a first probability value that exceeds all other probability values associated with all other hypothetical locations included in the plurality of hypothetical locations.

15. The non-transitory computer-readable medium of claim 14, wherein generating the first probability distribution comprises:

generating a likelihood distribution for the plurality of hypothetical locations, wherein the likelihood distribution indicates, for the first hypothetical location, a probability of the first historical wind vector occurring in conjunction with the second time offset when the first node resides at the first hypothetical location; and generating a posterior probability distribution that includes the first probability value based on the likelihood distribution.

16. The non-transitory computer-readable medium of claim 14, wherein the second time offset is generated based on a second cross-correlation between a third voltage time series associated with the first node and a fourth voltage time series associated with the second node.

17. The non-transitory computer-readable medium of claim 11, wherein the step of determining the first time offset comprises:

analyzing the first cross-correlation to determine a plurality of peaks;

identifying a first peak included in the plurality of peaks that resides at least a threshold distance away from an origin of the first cross-correlation; and determining the first time offset based on the first peak.

18. The non-transitory computer-readable medium of claim 11, wherein the first voltage fluctuation occurs when a first solar panel output is modified at the first location, and the second voltage fluctuation occurs when a second solar panel output is modified at the second location, wherein the first solar panel output is modified in response to a first cloud modifying solar irradiance at the first location, and the second solar panel output is modified in response to the first cloud modifying solar irradiance at the second location.

19. The non-transitory computer-readable medium of claim 18, wherein the first wind vector indicates a direction and a velocity of a first cloud that moves between the first location and the second location.

20. A system, comprising:

a first node that resides at a first location within a network where power is generated from sunlight, wherein the first node performs the steps of:

measuring, via one or more sensors associated with the first node, a first plurality of voltage fluctuations within a first power line to generate a first voltage time series, wherein the first node is coupled to the first power line, and one or more of the voltage fluctuations occur in response to changes in solar irradiance at the first location, generating a first cross-correlation between the first voltage time series and a second voltage time series, determining a first time offset based on the first cross-correlation, wherein the first time offset indicates a first delay between a first voltage fluctuation included in the first voltage time series and a second voltage fluctuation included in the second voltage time series, and computing a first wind vector based on the first location, the second location, and the first time offset, wherein the first wind vector indicates one or more points in time when solar power generation decreases at one or more locations within the network; and a second node that resides at a second location within the network where power is generated from sunlight, wherein the second node performs the steps of:

measuring a second plurality of voltage fluctuations within a second power line to generate the second voltage time series, wherein the second node is coupled to the second power line, and transmitting the second voltage time series to the first node across the network.

\* \* \* \* \*